US012802754B2

(12) United States Patent
Gopinath et al.

(10) Patent No.: US 12,802,754 B2
(45) Date of Patent: Nov. 17, 2026

(54) RESISTIVE RANDOM ACCESS MEMORY (RRAM) DEVICE AND MULTI-STEP MEMORY OPERATION WITH ALL WORD LINES ACTIVATED

(71) Applicant: GlobalFoundries U.S. Inc., Malta, NY (US)

(72) Inventors: Venkatesh Periyapatna Gopinath, Fremont, CA (US); Siva Kumar Chinthu, Bangalore (IN); Navneet K. Jain, Milpitas, CA (US); Suresh Pasupula, Andhra Predesh (IN)

(73) Assignee: GlobalFoundries U.S. Inc., Malta, NY (US)

( * ) Notice: Subject to any disclaimer, the term of this patent is extended or adjusted under 35 U.S.C. 154(b) by 110 days.

(21) Appl. No.: 18/942,888

(22) Filed: Nov. 11, 2024

(65) Prior Publication Data

US 2026/0134912 A1 May 14, 2026

(51) Int. Cl.
*G11C 13/00* (2006.01)

(52) U.S. Cl.
CPC ...... *G11C 13/0028* (2013.01); *G11C 13/0026* (2013.01); *G11C 13/003* (2013.01); *G11C 13/0038* (2013.01); *G11C 13/0061* (2013.01); *G11C 13/0069* (2013.01); *G11C 2213/79* (2013.01)

(58) Field of Classification Search
CPC ............ G11C 13/0028; G11C 13/0026; G11C 13/003; G11C 13/0038; G11C 13/0061; G11C 13/0069; G11C 2213/79
See application file for complete search history.

(56) References Cited

U.S. PATENT DOCUMENTS

| | | | | |
|---|---|---|---|---|
| 5,077,691 | A | 12/1991 | Haddad et al. | |
| 7,903,448 | B2 | 3/2011 | Oh et al. | |
| 10,930,346 | B1 * | 2/2021 | Ryu | G11C 13/0028 |
| 2011/0110144 | A1 * | 5/2011 | Kawai | G11C 13/0069 365/148 |
| 2012/0120712 | A1 * | 5/2012 | Kawai | G11C 13/0069 257/E21.645 |
| 2013/0058154 | A1 * | 3/2013 | Katagiri | G11C 29/50008 365/148 |
| 2014/0185362 | A1 | 7/2014 | Haukness | |

(Continued)

*Primary Examiner* — Mushfique Siddique
(74) *Attorney, Agent, or Firm* — Ramakrishnan Parthasarathy; Hoffman Warnick LLC

(57) ABSTRACT

Disclosed is a memory structure including: an array of resistive random access memory cells (bit cells) in columns and rows; word lines (WLs) connected to the rows; and source line (SL)-bit line (BL) pairs connected to the columns. The structure is configured to perform a multi-step operation (e.g., a multi-step forming operation) during which: all WLs receive a low WL voltage; all BLs and SLs (except for the SL connected to a selected column) are discharged to ground; and the SL connected to the selected column receives a SL voltage (VSL) that starts high and decreases with each step. The operation concurrently and progressively changes the resistance states of resistors in bit cells of the selected column from an initial resistance state to a lower operational resistance state. Throughout the operation, BL current (IBL) on the BL of the selected column is monitored and, when a threshold IBL is reached, the next step is initiated.

20 Claims, 6 Drawing Sheets

(56) References Cited

U.S. PATENT DOCUMENTS

| | | | | |
|---|---|---|---|---|
| 2014/0241035 | A1* | 8/2014 | Siau | G11C 7/20<br>365/148 |
| 2017/0047107 | A1* | 2/2017 | Berger | G11C 11/1675 |
| 2017/0117038 | A1* | 4/2017 | Liao | G11C 5/147 |
| 2018/0330785 | A1* | 11/2018 | Chang | G11C 13/003 |
| 2019/0080754 | A1* | 3/2019 | Tran | G11C 7/065 |
| 2019/0392897 | A1* | 12/2019 | Lu | G11C 13/0026 |
| 2020/0211644 | A1* | 7/2020 | Sekar | G11C 13/004 |
| 2022/0366980 | A1* | 11/2022 | Chou | G11C 7/12 |
| 2023/0207005 | A1* | 6/2023 | Lin | G11C 13/0038<br>365/148 |

* cited by examiner

RESISTIVE RANDOM ACCESS MEMORY (RRAM) DEVICE AND MULTI-STEP MEMORY OPERATION WITH ALL WORD LINES ACTIVATED

BACKGROUND

The present disclosure relates to memory structures and, more particularly, to embodiments of a memory structure (e.g., a resistive random access memory (RRAM) structure) and a method of operating the memory structure.

RRAM structures include an array of RRAM cells (also referred to herein as bit cells) arranged in columns and rows. Each bit cell can be, for example, a one-transistor one-resistor (1T1R) memory cell. Bit cells in each column can be connected between a source line (SL) and a bit line (BL) for the column. Bit cells in each row can be connected to a word line (WL) for the row. Specifically, each bit cell in a given column and a given row can include: a programmable resistor with a first terminal connected to the SL for the column and a second terminal opposite the first terminal; and an access transistor (e.g. a N-type field effect transistor) including a first source/drain region connected to the second terminal of the programmable resistor, a second source/drain region connected to the BL for the column, and a gate connected to the WL for the row.

Write operations in an RRAM structure can include a forming operation, a programming operation (also referred to herein as a set operation), and an erasing operation (also referred to herein as a reset operation). During a forming operation, the resistance state of the programmable resistor of a selected bit cell is switched from an initial very high resistance state (iHRS), as seen immediately after manufacturing, to an operational resistance state that is lower than the iHRS (e.g., to an operational high resistance state (HRS) or to an operational resistance state (LRS)). The HRS can be used to store, for example, a logic "0" and the LRS can be used to store, for example, a logic "1." During a programming operation, the resistance state of the programmable resistor in a selected bit cell is switched from the HRS to the LRS (i.e., to store a logic "1"). During an erasing operation, the resistance state of the programmable resistor in a selected bit cell is switched from the LRS to the HRS (i.e., to store a logic "0").

Typically, the forming operation is directed to a selected bit cell and includes concurrently applying a high positive voltage (e.g., +2.5V) to the WL connected to the selected bit cell, applying an even higher positive voltage (e.g., +4.0V) to the SL connected to the selected bit cell, and discharging the BL connected to the selected bit cell to ground. To accommodate these biasing conditions without placing the selected bit cell under undue stress, the access transistor of each bit cell is typically a high voltage transistor. Additionally, to avoid undue device stress in unselected bit cells, all other WLs, SLs and BLs in the RRAM structure also be connected to ground.

SUMMARY

Disclosed herein are embodiments of a memory structure (e.g., a resistive random access memory (RRAM) structure). The structure can include an array of bit cells (e.g., RRAM cells) arranged in columns and rows. The structure can further include word lines (WLs) connected to the rows and a WL decode block including WL drivers connected to the WLs. The structure can further include a voltage generation block including a first charge pump connected to the WL decode block. The first charge pump can output a WL voltage (VWL) (e.g., a relatively low VWL) to the WL decode block and, during a memory operation, the WL drivers can concurrently apply the same VWL to all the WLs. The memory operation can, for example, be a multi-step forming operation directed to a selected column.

Also disclosed herein are embodiments of a method of operating a memory structure (e.g., an RRAM structure). The structure can include an array of bit cells (e.g., RRAM cells) arranged in columns and rows. The structure can further include word lines (WLs) connected to the rows and a WL decode block including WL drivers connected to the WLs. The structure can further include a voltage generation block including a first charge pump connected to the WL decode block. The method can include performing a memory operation (e.g., a multi-step forming operation directed to a selected column) in the memory structure. The memory operation can include outputting, by the first charge pump to the WL decode block, a WL voltage (VWL) to the WL decode block and concurrently applying, by the WL drivers, that same VWL to all the WLs.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

Figure 1:
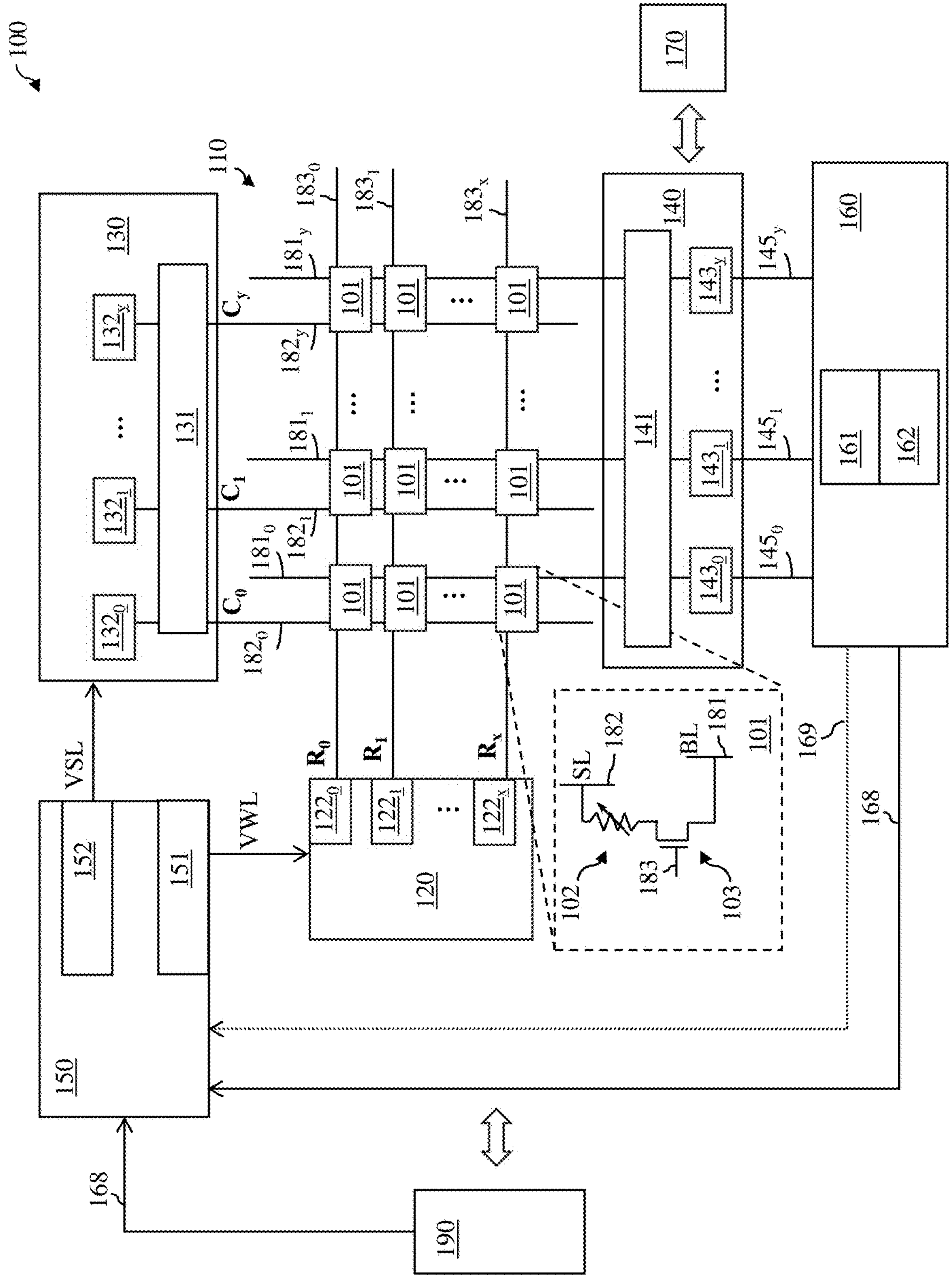
FIG. 1 is a schematic diagram illustrating embodiments of a disclosed memory structure.

As mentioned above, write operations in an RRAM structure can include a forming operation, a programming operation (also referred to herein as a set operation), and an erasing operation (also referred to herein as a reset operation). During a forming operation, the resistance state of the programmable resistor of a selected bit cell is switched from an initial very high resistance state (iHRS), as seen immediately after manufacturing, to an operational resistance state that is lower than the iHRS (e.g., to an operational high resistance state (HRS) or to an operational resistance state (LRS)). The HRS can be used to store, for example, a logic "0" and the LRS can be used to store, for example, a logic "1." During a programming operation, the resistance state of the programmable resistor in a selected bit cell is switched from the HRS to the LRS (i.e., to store a logic “1”). During an erasing operation, the resistance state of the programmable resistor in a selected bit cell is switched from the LRS to the HRS (i.e., to store a logic “0”).

Typically, the forming operation is directed to a selected bit cell and includes concurrently applying a high positive voltage (e.g., +2.5V) to the WL connected to the selected bit cell, applying an even higher positive voltage (e.g., +4.0V) to the SL connected to the selected bit cell, and discharging the BL connected to the selected bit cell to ground. To accommodate these biasing conditions without placing the selected bit cell under undue stress, the access transistor of each bit cell is typically a high voltage transistor. Additionally, to avoid undue device stress in unselected bit cells, all other WLs, SLs, and BLs in the RRAM structure can also be connected to ground.

In view of the foregoing, disclosed herein are embodiments of a memory structure and, particularly, a resistive random access memory (RRAM) structure (hereinafter referred to as the structure) and a method of operating the structure including a multi-step forming operation during which the same relatively low word line voltage (VWL) is applied to all word lines (WLs) (i.e., during which all WLs are concurrently activated with the same relatively low VWL). The structure can include an array of RRAM cells (hereinafter referred to as bit cells) arranged in columns and rows. It can further include word lines (WLs) connected to the rows of bit cells, respectively, and source line (SL)-bit line (BL) pairs connected to the columns of bit cells, respectively. The structure can further be configured to perform a memory operation (e.g., a novel multi-step forming operation) during which all WLs for all rows are activated with the same relatively low positive word line voltage (VWL) (e.g., VWL=0.4V). In such a memory operation, all BLs and all SLs (except for a SL connected to bit cells in a selected column) can be connected to ground, while the SL connected to the bit cells in the selected column can receive a source line voltage (VSL) that starts at a relatively high positive voltage level (e.g., VSL=4.0V) during a first step of the memory operation and that decreases with each successive step. As a result of this multi-step forming process, the resistance states of the programmable resistors in the bit cells of the selected column concurrently and progressively (with the performance of each step) change from an initial resistance state to an operational resistance state that is lower than the initial resistance state (e.g., from an initial high resistance state (iHRS) to an operational high resistance state (HRS)). Throughout this memory operation, current on the BL of the selected column can be monitored (e.g., sensed by a self-termination circuit (STC)) and, when a threshold current level is reached (indicating that the current step in the multi-step forming operation has been completed), a feedback circuit causes the next step in the multi-step memory operation to be initiated. The steps can continue until the last step (e.g., performed using the lowest VSL) is completed and the desired operational resistance state (e.g., HRS) is reached. By configuring the structure with additional circuitry to enable such a multi-step forming operation, power, performance, and area (PPA) may be significantly improved over conventional structures. For example, power consumption may be reduced because the VWL is low (e.g., 0.4V) and, particularly, significantly less than the 2.5V VWL required for the forming operation in a conventional structure. Additionally, area consumption may be reduced because relatively small, low voltage transistors (e.g., 0.8V transistors) may be included in the bit cells with minimal, if any, risk of safe operating area (SOA) violations. Finally, performance may be improved because bit line current is limited during the multi-step forming operation and, thus, electromigration (EM) and IR drop violations may be avoided.

Specifically, FIG. 1 is a schematic diagram illustrating a disclosed embodiment of a memory structure and, particularly, a resistive random access memory (RRAM) structure (hereinafter referred to as structure 100) configured to facilitate performance of a multi-state forming operation during which the same relatively low word line voltage (VWL) is concurrently applied to all word lines (WLs).

Structure 100 can include: an array 110 of RRAM cells (hereinafter referred to as bit cells 101) arranged in columns (C0-Cy) and rows (R0-Rx); bit lines (BLs) $\mathbf{181}_0$-$\mathbf{181}_y$ for the columns (C0-Cy), respectively; source lines (SLs) $\mathbf{182}_0$-$\mathbf{182}_y$ for the columns (C0-Cy), respectively; and word lines (WLs) $\mathbf{183}_0$-$\mathbf{183}_x$ for the rows (R0-Rx), respectively. In one example, structure 100 array 110 could include 4864 columns (i.e., C0-C4863) and 512 rows (i.e., R0-R511) of bit cells 101.

Structure 100 can further include a controller 190 and, in communication with controller 190, peripheral circuitry connected to BLs $\mathbf{181}_0$-$\mathbf{181}_y$, SLs $\mathbf{182}_0$-$\mathbf{182}_y$ and WLs $\mathbf{183}_0$-$\mathbf{183}_x$ to facilitate the performance of both write operations (including forming, programming, and erasing operations) and read operations. For example, this peripheral circuitry can include components for establishing specific biasing conditions on WLs, SLs, and BLs in the array during forming, programming, erasing, or read operations. Specifically, the peripheral circuitry can include, but is not limited to, a voltage generation block 150 and various decode blocks connected to the voltage generation block 150. Decode blocks can include, for example, a WL decode block 120 connected to the WLs, a SL decode block 130 connected to the SLs, and a BL decode block 140 connected to the BLs. Voltage generation block 150 can be configured to generate and output different voltages required for establishing specific biasing conditions during the memory operations. These decode blocks can be configured to receive control signals (e.g., address signals from controller 190) and to decode those signals. These decode blocks can further be configured to receive bias voltages from voltage generation block 150 and, based on the decoded address signals, cause drivers contained therein to selectively apply appropriate bias voltages to the WLs, SLs, or BLs (as applicable). The peripheral circuitry can also include a sense circuit 170, which is connected to BLs $\mathbf{181}_0$-$\mathbf{181}_y$ and which includes one or more sense amplifiers. Sense circuit 170 can be configured to determine a stored data value in a selected bit cell during a read operation by sensing a change in an electrical parameter (e.g., voltage or current) on a BL, which is connected to the selected bit cell.

Peripheral circuitry, as described above, facilitates the performance of both write operations (e.g., forming, programming, and erasing operations) and read operations in RRAM structures is generally known in the art. Thus, details of this peripheral circuitry have been omitted from this specification, except for those specific details associated with the multi-step forming operation mentioned above and discussed in greater detail below.

More specifically, as illustrated in FIG. 1, each bit cell 101 can include a programmable resistor 102 and an access transistor 103 (e.g., an N-type field effect transistor (NFET)). Within each bit cell 101 in a given column, programmable resistor 102 and access transistor 103 (e.g., NFET) can be electrically connected in series between the SL and BL for that column. Additionally, within each bit cell 101 in a given row, the gate of access transistor 103 can be electrically connected to the WL for that row.

FIGS. 2A-2D are cross-section diagrams illustrating, in greater detail, an example of a bit cell 101 (including an access transistor 103 and a programmable resistor 102) that can be incorporated into the array 110 of FIG. 1. FIGS. 2A-2D further illustrate different programming states of programmable resistor 102 in bit cell 101, respectively.

As illustrated in FIGS. 2A-2D, access transistor 103 can be a field effect transistor (FET), such as an NFET. Specifically, access transistor 103 can include a first N-type source/drain 231, a second N-type source/drain region 232, and a channel region 233 (e.g., a P-channel region or intrinsic channel region) between the two source/drain regions 231-232. Optionally, the source/drain regions and channel region therebetween can be within an upper portion of a semiconductor layer or semiconductor substrate 201, which has, for example, P-conductivity and which is electrically connected to ground 198. Access transistor 103 can further include a gate 235 adjacent to channel region 233. Various different NFET configurations are known in the art, any of which could be incorporated into a bit cell 101. Thus, a more detailed description of the NFET has been omitted from the specification in order to allow the reader to focus on the salient aspects of the disclosed embodiments. It should, however, be noted that because of the unique configuration of the peripheral circuitry in structure 100, which allows for the forming operation to be performed in multiple steps using a relatively low VWL (e.g., VWL≤0.4V), access transistor 103 can be a low voltage device, which is relatively small in size. For example, access transistor 103 could be a low threshold voltage NFET (LVTNFET) with a relatively low maximum voltage rating (e.g., a 0.8V LVTNFET), a channel length of 160 nanometers (nm), and a channel width of 40 nm.

Programmable resistor 102 can be a memristor or other similar type of programmable resistor having two-terminals (i.e., a first terminal 221 and a second terminal 222). First terminal 221 can be electrically connected to the SL for the column containing the bit cell 101. Second terminal 222 can be electrically connected to source/drain region 232 of access transistor 103. Source/drain region 231 of access transistor 103 can be electrically connected to the BL for the column containing the bit cell. Thus, programmable resistor 102 and access transistor 103 are electrically connected in series between the SL and the BL for the same column. Additionally, gate 235 of access transistor 103 can be connected to the WL for the row containing the bit cell. In some embodiments, programmable resistor 102 can be a back end of the line (BEOL) multi-layer structure and, particularly, a BEOL metal-insulator-metal (MIM) structure. The MIM structure can include a first metal layer 212 (at first terminal 221). First metal layer 212 can include one or more layers of metal or metal alloy materials (e.g., titanium, titanium nitride and/or any other suitable metal or metal alloy material). The MIM structure can further include a second metal layer 214 (at second terminal 222). The second metal layer 214 can include one or more layers of metal or metal alloy materials (e.g., titanium, titanium nitride and/or any other suitable metal or metal alloy material). The MIM structure can further include an insulator layer 213 (also referred to as a switching layer) stacked between the two metal layers 212 and 214 and including one or more layers of isolation material (e.g., hafnium oxide and/or any other suitable insulator material).

Figures 2A, 2B:
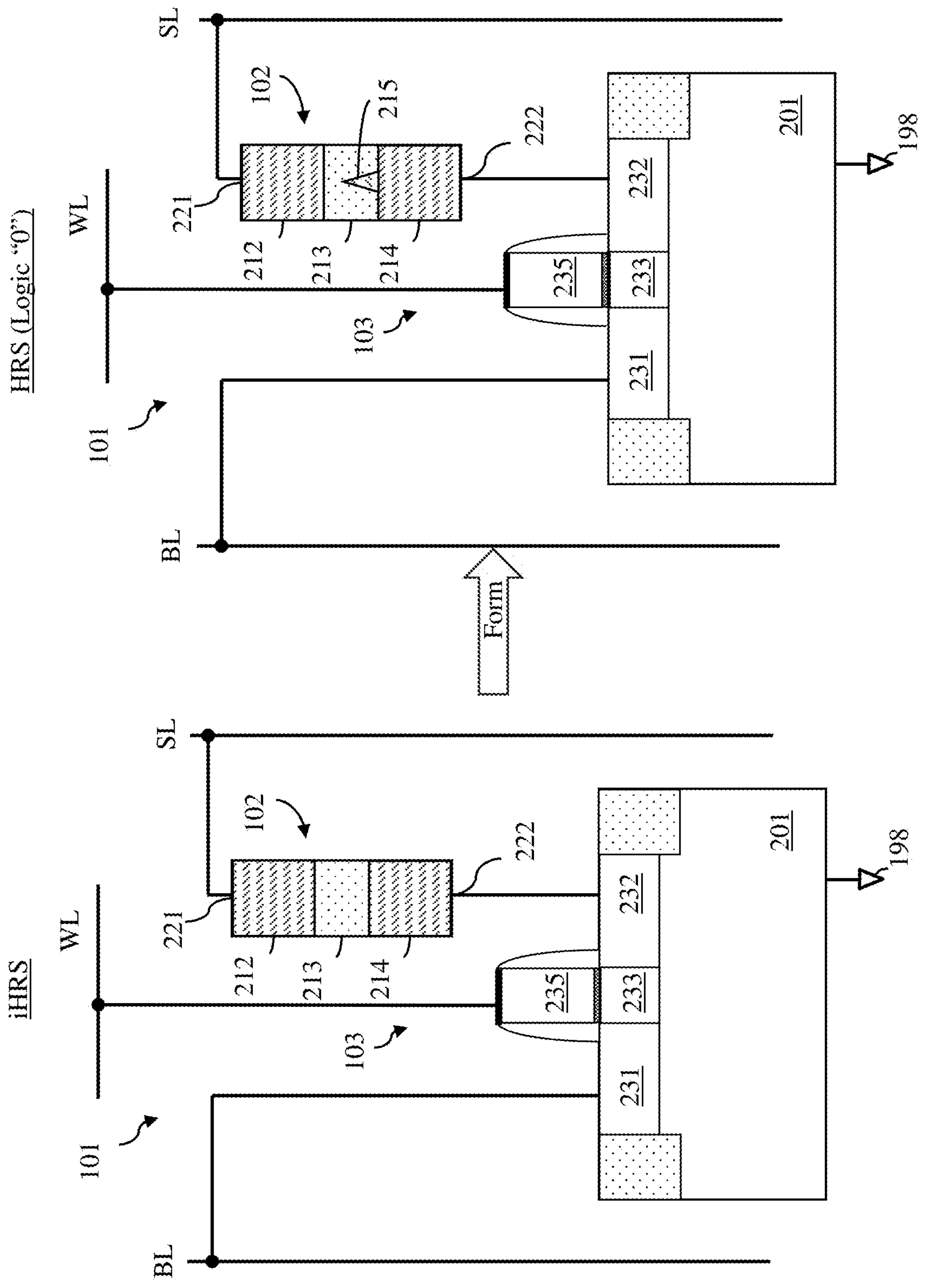
FIGS. 2A-2D are diagrams illustrating a different resistance states, respectively, of a bit cell that can be incorporated into the memory structure of FIG. 1.

As illustrated in FIG. 2A, the post-manufacture resistance state of programmable resistor 102 can be an initial high resistance state (iHRS). iHRS can, for example, be approximately 100 megaohms (MΩ) or higher. During a forming operation (as discussed in greater detail below), specific bias voltages on terminals 221 and 222 can be employed to switch programmable resistor 102 to an operational state that is lower than iHRS. Programmable resistor 102 can have, for example, two operational states including an operational high resistance state (HRS) (e.g., of approximately 50 kilohms (kΩ)) for storing a first logic value (e.g., a logic "0") and an operational low resistance state (LRS) (e.g., of approximately 5 kΩ) for storing a second logic value (e.g., a logic "1"). For purposes of illustration, the forming operation described herein is employed to change the resistance state from iHRS to HRS to store the first logic value. Thus, as illustrated in FIG. 2B, during the forming operation specific bias voltages on terminals 221 and 222 can be employed to initiate metal ion migration through insulator layer 213. Such metal ion migration can result in the formation of conductive filament(s) 215 that extend at least partially through insulator layer 213 between metal layers 212 and 214, thereby reducing the resistance state of the programmable resistor 102 from iHRS to HRS to store the first logic value (e.g., logic "0"). As mentioned above, in a conventional RRAM structure, this forming operation is achieved by applying a high positive voltage (e.g., 2.5V) to the WL of a row containing a selected bit cell 101, applying an even higher positive voltage (e.g., 4.0V) to the SL of a column containing the selected bit cell 101, and connecting all other WLs, all other SLs and all BLs to ground. However, as discussed in greater detail below, peripheral circuitry in structure 100 can be uniquely configured to allow for a novel multi-step forming operation during which: (a) all WLs for all rows concurrently receive the same low VWL (e.g., VWL≤0.4V); (b) the SL connected to a selected column receives a VSL that from a drops from a relatively high VSL (e.g., VSL=4.0V) with each successive step (e.g., down to VSL=1.3V or 1.0V); and (c) all other SLs and all BLs are connected to ground. As a result, the forming operation is concurrently performed with respect to all bit cells 101 in the selected column.

Figure 2D:
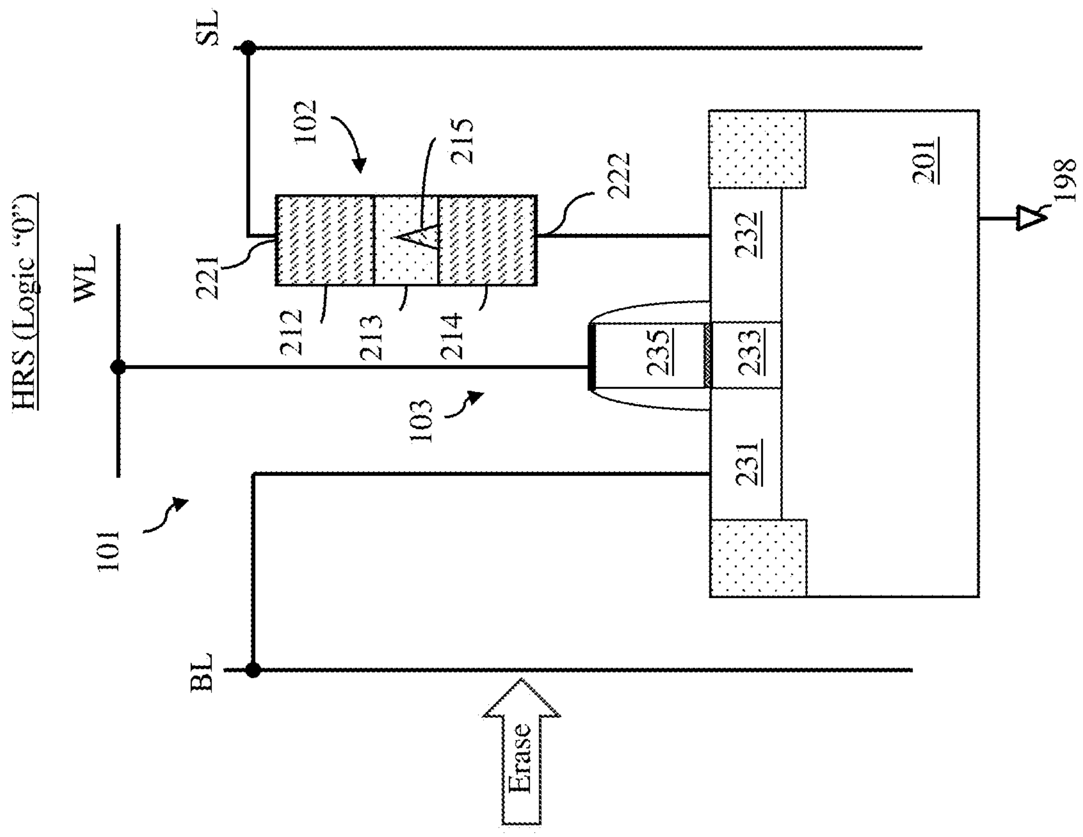
Figure 2C:
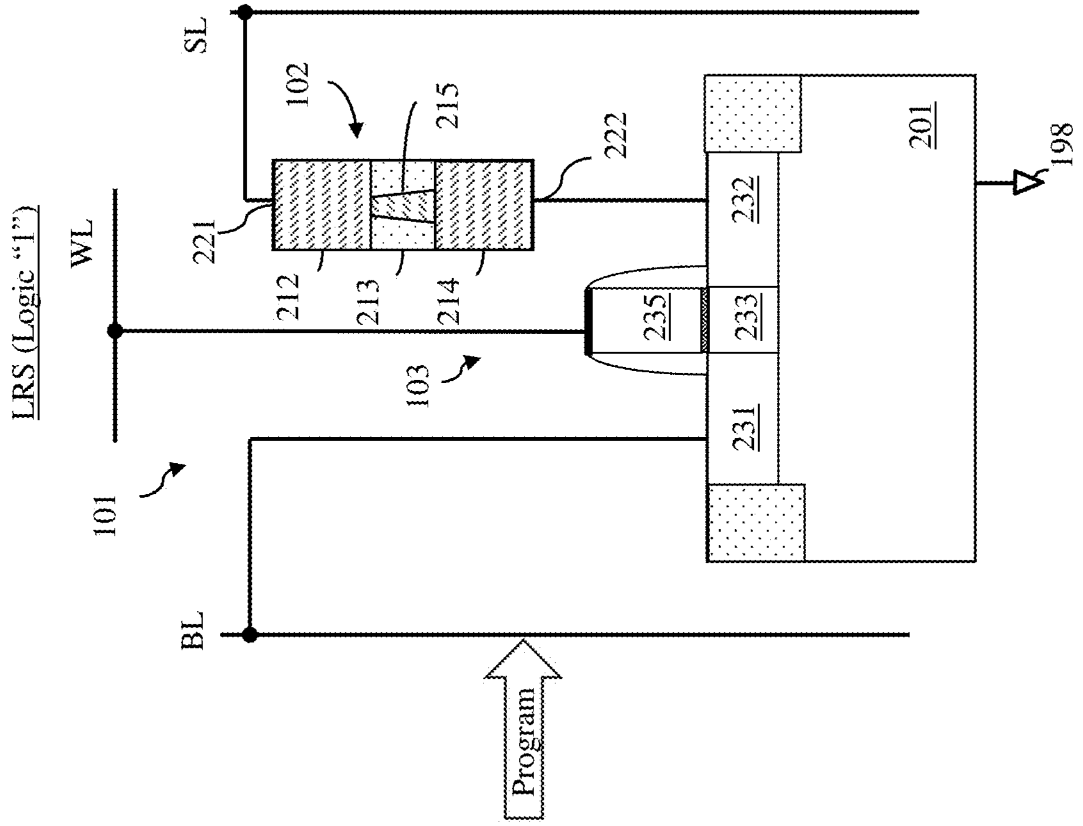

As illustrated in FIG. 2C, during a programming operation (also referred to herein as a setting operation), specific bias voltages on the terminals 221 and 222 can be employed to cause further metal ion migration through insulator layer 213 in the programmable resistor 102 of a selected bit cell 101. This additional metal ion migration can increase the numbers and/or lengths of conductive filament(s) 215 extending through insulator layer 213 between and contacting metal layers 212 and 214 (e.g., so that metal layers 212 and 214 are electrically connected), as illustrated, in order to store the second logic value (e.g., logic "1"). In the disclosed embodiments, this programming operation can be achieved using any known techniques employed in conventional RRAM structures. For example, programming could be achieved by applying a high positive word line voltage (VWL) (e.g., VWL=2.5V) to the WL of a row containing a selected bit cell 101 and applying a similarly high positive source line voltage (VSL) (e.g., VSL=2.5V) to the SL of a column containing the selected bit cell 101, and further connecting all other WLs, all other SLs, and all BLs to ground.

As illustrated in FIG. 2D, during an erasing operation (also referred to herein as a resetting operation), specific bias voltages on the terminals 221 and 222 can be employed to change the direction of metal ion migration through insulator layer 213 in order to break-up of conductive filament(s) 215 extending through insulator layer 213 between metal layers 212 and 214 in the programmable resistor 102 of a selected bit cell 101 (e.g., so that metal layers 212 and 214 are no longer electrically connected), as illustrated, to again store the first logic value (e.g., logic "0"). In the disclosed embodiments, this erasing operation can be achieved using any known techniques employed in conventional RRAM structures. For example, erasing could be achieved by applying a high positive word line voltage (VWL) (e.g., VWL=3.8V) to the WL, applying a high positive bit line voltage (VBL) (e.g., VBL=3.0V) to the BL of a column containing the selected bit cell 101, and connecting all other WLs, all other BLs and all SLs to ground.

In addition to these write operations (i.e., forming, programming, and erasing), each a bit cell 101 can be individually and selectively subjected to a read operation. During a read operation, specific biasing conditions can be applied to determine the stored logic value in programmable resistor 102 of a selected bit cell 101. In the disclosed embodiments, this read operation can be achieved using any known techniques employed in conventional RRAM structures. For example, reading could be achieved by applying a read voltage (referred to herein as VREAD) (e.g., VREAD=150 mV) to the BL of a column containing a selected bit cell 101, applying a VWL at a positive supply voltage (VDD) level (e.g., VDD=1.8V) to a WL of a row containing the selected bit cell 101, and connecting all other BLs, all other WLs, and all SLs to ground. Concurrently, during this read operation, sense circuit 170 can sense a change in an electrical parameter on the BL connected to the selected bit cell when access transistor 103 turns on in response to VWL. Based on the sensed electrical parameter, sense circuit 170 can output a data output value indicative of the logic value "1" or "0" stored in the selected bit cell.

Referring again to FIG. 1, to facilitate performance of the novel multi-step forming operation, voltage generation block 150 can include a first charge pump 151 (also referred to herein as a low voltage charge pump) and a second charge pump 152 (also referred to herein as a high voltage charge pump). First charge pump 151 can generate and output (i.e., can be configured to generate and output, can be adapted to generate and output, etc.) at least one relatively low VWL (e.g., VWL=0.4V) during a multi-step forming operation in response to a particular VWL trim code 169 (e.g., received from controller 190 or, alternatively, received from a feedback circuit 160, as discussed in greater detail below). Second charge pump 152 can generate and output (i.e., can be configured to generate and output, can be adapted to generate and output, etc.) VSL at different voltage levels during different steps, respectively, of the multi-step forming operation in response to different VSL trim codes 168 (e.g., received from feedback circuit 160, as discussed in greater detail below). The different voltage levels of VSL at the different steps can decrease with each successive step in the multi-step forming operation. Specifically, at the first step in the multi-step forming operation, second charge pump 152 can output VSL at a relatively high voltage level and the voltage level can drop with each successive step thereafter. For example, in a six-step forming operation, VSL can be output from second charge pump 152 as follows: Step 1—4.0V; Step 2—3.0V, Step 3—2.0V; Step 4—1.5V; Step 5—1.3V; and Step 6—1.0V. It should be noted that this example is provided for illustration purposes and the number of steps and/or the different VSL voltage levels are not intended to be limiting.

Various different charge pump circuits capable of selectively outputting a bias voltage at any one of multiple different voltage levels in response to different trim codes are known in the art. Any of these now known charge pump circuits (or any suitable later developed charge pump circuits) that are capable of generating a relatively low VWL (e.g., VWL=0.4V or 0.375V) and capable of generating a VSL at various different voltage levels (e.g., from a relatively high voltage level, such as 4.0V, down to some predetermined minimum voltage level, such as 1.3V or 1.0V) could be incorporated into voltage generation block 150 of structure 100 as first charge pump 151 and second charge pump 152, respectively.

In any case, first charge pump 151 can be connected to WL decode block 120. WL decode block 120 can include WL drivers $\mathbf{122_0}$-$\mathbf{122_x}$, which are electrically connected to WLs $\mathbf{183_0}$-$\mathbf{183_x}$, respectively. And, during the multi-step forming operation, WL decode block 120 can receive VWL from first charge pump 151 and can cause (i.e., can be configured to cause, can be adapted to cause, etc.) WL drivers $\mathbf{122_0}$-$\mathbf{122_x}$ to concurrently apply LV_VWL to all WLs $\mathbf{183_0}$-$\mathbf{183_x}$.

Second charge pump 152 can be connected to SL decode block 130. SL decode block 130 can include a SL multiplexer 131 (SL MUX) connected to SLs $\mathbf{182_0}$-$\mathbf{182_y}$ and multiple SL drivers $\mathbf{132_0}$-$\mathbf{132_y}$, which are selectively connectable to SLs $\mathbf{182_0}$-$\mathbf{182_y}$ through SL MUX 131. And, during the multi-step forming operation, SL decode block 130 can receive VSL from second charge pump 152 and can cause (i.e., can be configured to cause, can be adapted to cause, etc.) SL MUX 131 to: (a) connect the SL for a selected column to a corresponding SL driver so that VSL (which as mentioned above decreases with each successive step) is applied to that SL; and (b) connect all other SLs to ground.

BL decode block 140 can further include a BL multiplexer 141 (BL MUX) connected to BLs $\mathbf{181_0}$-$\mathbf{181_y}$. And, during the multi-step forming operation, BL decode block 140 can cause (i.e., can be configured to cause, can be adapted to cause, etc.) BL MUX 141 to connect all BLs to ground. BL decode block 140 can further include at least one self-termination circuit (STC) connectable to BLs $\mathbf{181_0}$-$\mathbf{181_y}$ through BL MUX 141. For purposes of illustration, BL decode block 140 is shown as having multiple STCs $\mathbf{143_0}$-$\mathbf{143_y}$ (one for each BL). And, during the multi-step forming operation, BL decode block 140 can cause (i.e., can be configured to cause, can be adapted to cause, etc.) BL MUX 141 to connect an STC (which is enabled) to a BL for a selected column.

Each STC $\mathbf{143_0}$-$\mathbf{143_y}$ can be configured to selectively monitor and, particularly, to selectively sense a bit line current (IBL) on a BL of a selected column, when enabled during a forming operation, and to output a digital output signal (Dout) $\mathbf{145_0}$-$\mathbf{145_y}$ with a first logic value (e.g., logic "0") when the IBL is below a threshold bit line current level (IBLmax) and with a second logic value (e.g., a logic "1") when IBL is at or above IBLmax.

Figure 3:
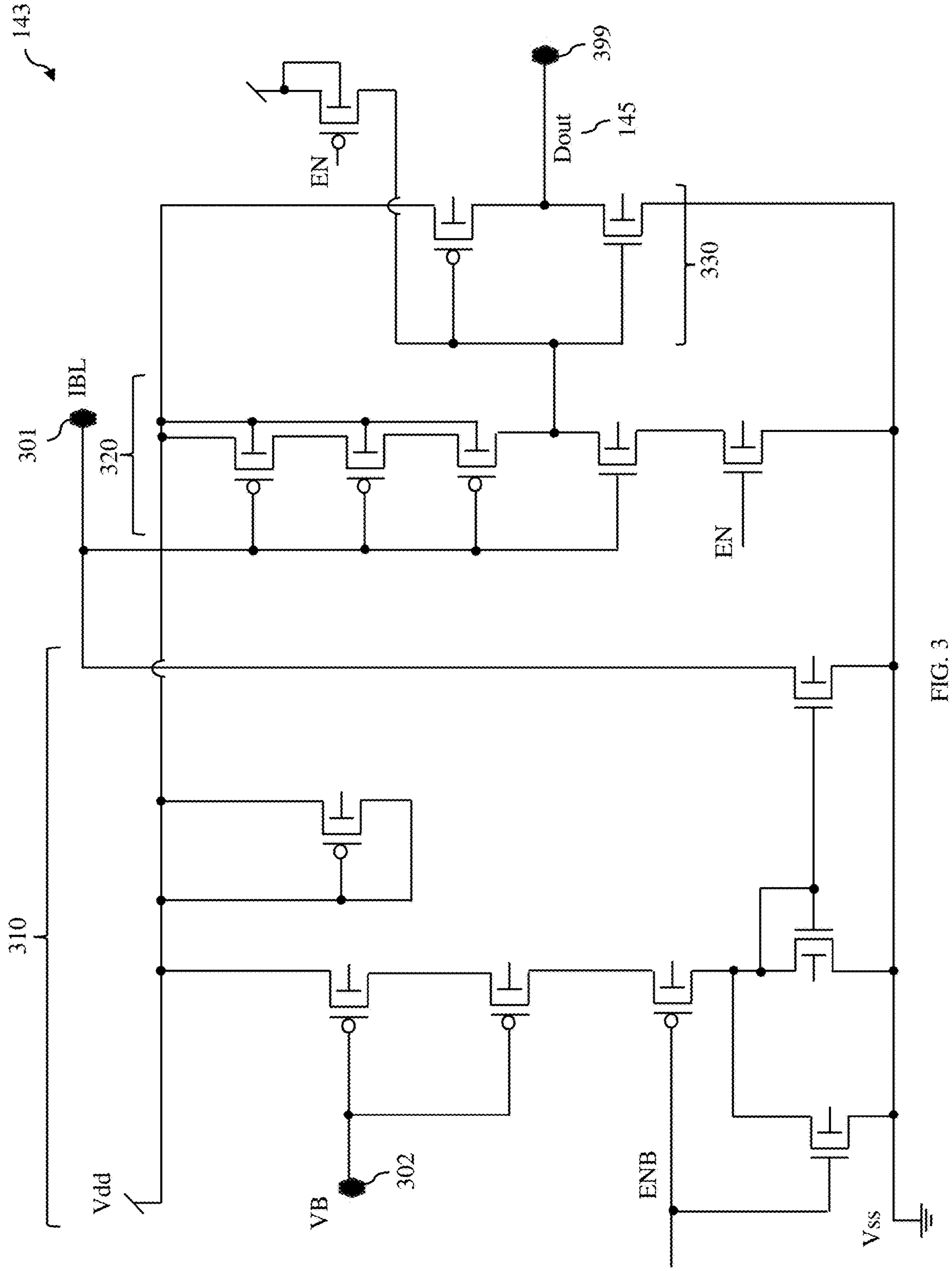
FIG. 3 is a schematic diagram illustrating a self-termination circuit (STC) that can be incorporated into the memory structure of FIG. 1.

FIG. 3 is one example of an STC 143 that could be incorporated into BL decode block 140 of structure 100. As illustrated, this STC 143 can be connected to receive an enable signal (EN) and an inverted enable signal (ENB) for the forming operation. When EN is high and ENB is low, the specific STC 143 will switch to an on-state (i.e., will be enabled). STC 143 can include a current mirror-controlled first inverter 320 (i.e., a first inverter 320 controlled by a current mirror 310) with an input terminal connected to STC input node 301 (which is connected to receive an IBL from the BL of a selected column) and with an output terminal. When IBL on STC input node 301 reaches IBLmax, the output at the output terminal of first inverter 320 will switch from a high voltage level to a low voltage level. STC 143 can further include a second inverter 330 with an input terminal connected to the output terminal of first inverter 320 and with an output terminal connected to an STC output node 399. When the voltage level on the input terminal of second inverter 330 is high, a digital output signal (Dout) 145 at STC output node 399 will be at logic "0." When the voltage level on the input terminal of second inverter 330 goes low, Dout 145 on STC output node 399 will switch to a logic "1." It should be noted that the IBLmax can be, for example, set at a predetermined maximum bit cell current level (IBCmax) multiplied by the total number of bit cells in each column (i.e., multiplied by the total number of rows in array 110). This bit cell current level can be, for example, predetermined so as to avoid placing the access transistor 103 in any given bit cell within the selected column under undue stress (e.g., to ensure that the drain voltage (Vd) on access transistor 103 does not rise above some Vdmax) during the multi-step forming operation. For example, in some embodiments, Vdmax could be 1.24V with IBCmax being 1 μA. Therefore, if array 110 includes 512 rows, IBLmax would be 1 μA*512 or 512 μA. Those skilled in the art will recognize that in a STC structure as shown in FIG. 3, the bias voltage (VB) can be selectively adjusted to ensure that first inverter 320 and thereby second inverter 330 switch states when the IBLmax is reached at STC input node 301.

Structure 100 can further include a feedback circuit 160 connected to BL decode block 140 and to voltage generation block 150. During the multi-step memory operation, feedback circuit 160 can receive a Dout $145_0$-$145_y$ from a corresponding STC $143_0$-$143_y$ and can change (i.e., can be configured to change, adapted to change, etc.) the VSL trim code 168 supplied to second charge pump 152 in voltage generation block 150 when that Dout switches from logic "0" to logic "1." For example, feedback circuit 160 can include a counter 162 (also referred to herein as a state machine). Counter 162 can decrement (i.e., can be configured to decrement, adapted to decrement, etc.) a binary number, each time the Dout switches from logic "0" to logic "1" indicating completion of a current step in the multi-step forming operation and triggering initiation of the next step multi-step forming operation. This binary number can be output from feedback circuit 160 to voltage generation block 150 as VSL trim code 168. Decrementing the binary number (i.e., the VSL trim code) at the completion of each step, causes second charge pump 152 to drop the voltage level of VSL for the next step in the multi-step forming operation (as discussed above with regard to second charge pump 152). Optionally, feedback circuit 160 can further include a delay element 161, which is connected between the input to the feedback circuit (and thereby any STC $143_0$-$143_y$) and counter 162. Delay element 161 (e.g., a buffer) can delay Dout for some period of time (e.g., approximately 10 ns) to prevent premature switching of VSL trim code 169 before IBL is steady at or above IBLmax.

In the above-described structure 100, this novel multi-step forming operation concurrently and progressively (with the performance of each step) changes resistance states of programmable resistors 102 of all bit cells 101 in a selected column from a post-manufacture initial high resistance state (iHRS) (e.g., of ~100 MΩ or higher) to, for example, an operational high resistance state (HRS) (e.g., of ~50 kΩ) for storing a first logic value (e.g., a logic "0"). Furthermore, by employing this multi-step forming operation, power, performance, and area (PPA) may be significantly improved over conventional structures. For example, power consumption may be reduced because the VWL is low (e.g., 0.4V). Additionally, area consumption may be reduced because relatively small, low voltage access transistors 103 (e.g., 0.8V transistors) may be included in bit cells 101 without risking safe operating area (SOA) violations. Finally, performance may be improved because IBL is limited to IBLmax during the multi-step forming operation and, thus, electromigration (EM) and IR drop violations may be avoided.

Figure 4:
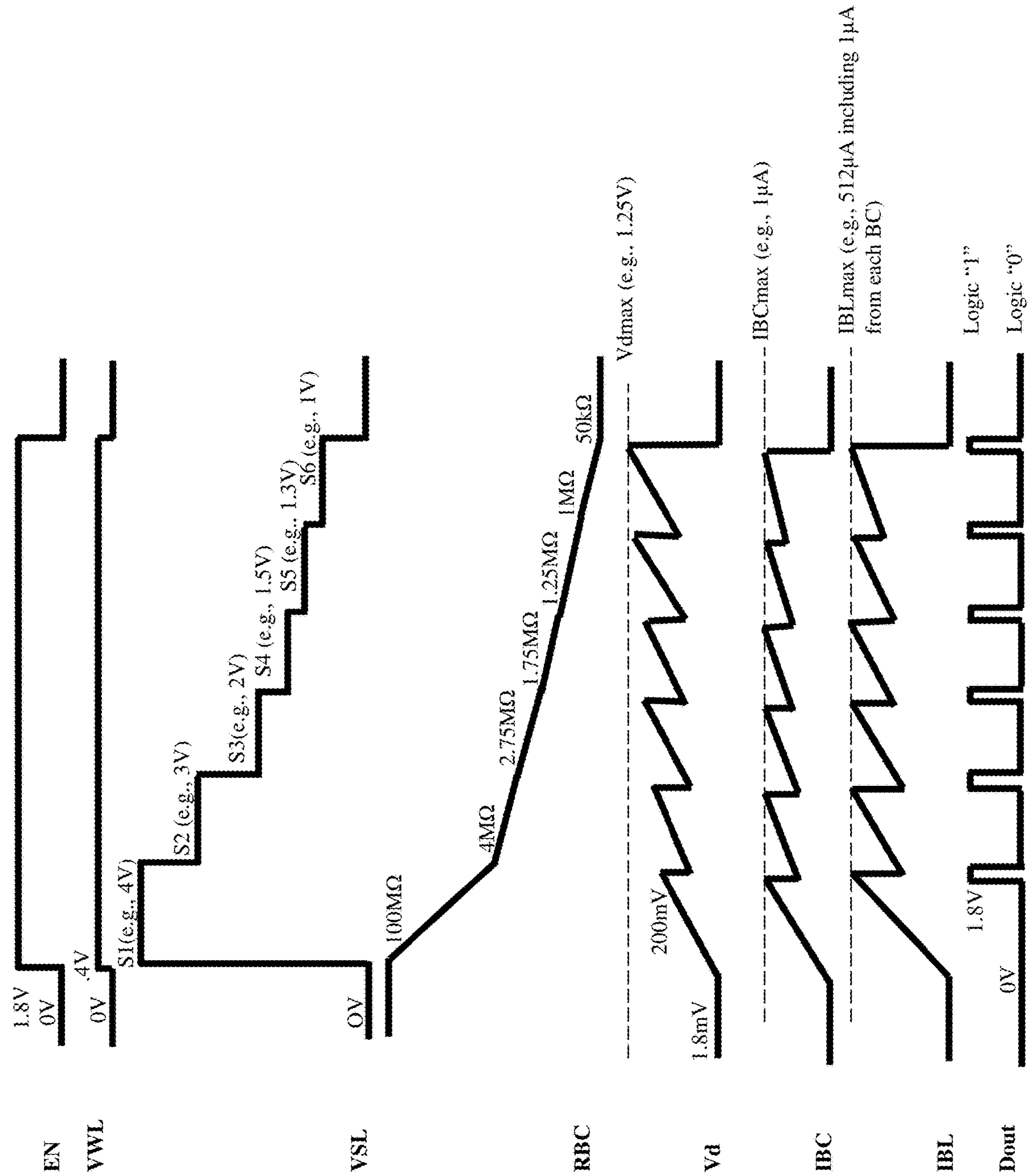
FIG. 4 is a timing diagram illustrating different electrical parameters during a multi-state forming operation performed in the memory structure of FIG. 1.

FIG. 4 is a timing diagram illustrating examples of changes in various electrical parameters in structure 100 during the above-described multi-step forming operation when an STC is enabled (EN) and VWL is concurrently applied to all WLs. As illustrated, in first step (S1), when VSL is at the highest voltage level (e.g., 4.0V) and Dout from the STC is low, drain voltage (Vd) from each bit cell in the selected column, IBC and IBL will all begin to rise and resistance of the programmable transistor in each bit cell (RBC) in the selected column will begin to fall. When IBL reaches IBLmax, Dout will go high, thereby indicating the completion of S1 and initiating second step (S2) by causing VSL to drop (e.g., down to 3.0V). As illustrated, once VSL drops to 3.0V at the beginning of S2, Dout will go low and Vd, IBC, and IBL will also drop to some degree. Then, during S2, IBC, IBL, and Vd will begin to rise again and RBC will continue to fall. When IBL again reaches IBLmax, Dout will go high, thereby indicating the completion of S2 and initiating the third step (S3) by causing VSL to drop (e.g., down 2.0V) and so forth until the last trim bit code for the last VSL is output signaling the last step in the multi-step forming operation.

It should be noted that, in further embodiments, feedback circuit 160 could include an additional counter (not shown). This additional counter could, for example, decrement a binary number output to first charge pump 151 as VWL trim code 169 at the last step (or last few steps) in order to decrease the voltage level of VWL output to WL decode block 120 and concurrently applied by WL drivers $122_0$-$122_x$ to WLs $183_0$-$183_x$ during the last step(s). By further reducing VWL (e.g., from 0.4V to 0.35) RBC may be adjusted with finer granularity. In other alternative embodiments, a multi-step forming operation could be performed as described above with the same VWL being used for each step. However, controller 190 could change the VWL trim code 169 and cause a second forming operation to be performed with respect to the selected column using VWL at an even lower voltage level (e.g., reduced from 0.4V to 0.35) if the desired resistance state (e.g., HRS) is not verified after the multi-step forming operation. See the verification process discussed in greater detail below with regard to the method embodiments.

Figure 5:
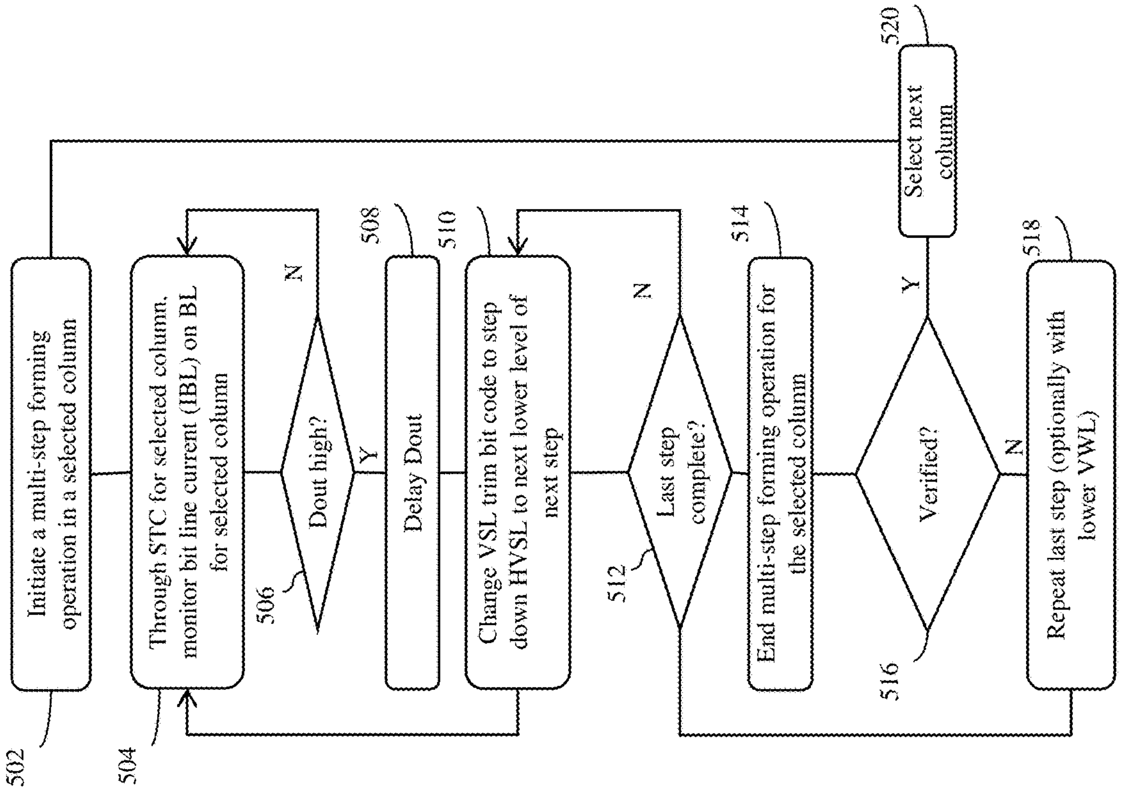
FIG. 5 is a flow diagram illustrating embodiments of a disclosed method.

FIG. 5 is a flow diagram illustrating embodiments of a method of operating structure 100 of FIG. 1 and, particularly, embodiments of a method of performing a multi-step forming operation therein.

Referring to FIG. 5 in combination with FIG. 1, the method can include initiating (e.g., in response to control signals from controller 190) a multi-step forming operation for all bit cells 101 in a selected column in array 110 of structure 100 (see process 502). For purposes of illustration, the method is described below with C0 being the selected column. Initiating the multi-step forming operation at process 502 can include providing a VWL trim code 169 to first charge pump 151 so as to cause first charge pump 151 to generate and output VWL at a relatively low voltage level (e.g., VWL=0.4V) to WL decode block 120 and further providing a step 1 (S1) VSL trim code 168 to second charge pump 152 to cause second charge pump 152 to generate and output VSL at a relatively high voltage level (e.g., VWL=4.0V) to SL decode block 130. Initiating the multi-step forming operation at process 502 can further include selectively connecting SL driver $\mathbf{132}_0$ for selected column C0 to SL $\mathbf{182}_0$ of selected column C0 via SL MUX 131 and further selectively connecting STC $\mathbf{143}_0$ for selected column C0 to BL $\mathbf{181}_0$ of selected column C0 via BL MUX 141. Initiating the multi-step forming operation at process 502 can further include enabling SL driver $\mathbf{132}_0$ and further enabling all WL drivers $\mathbf{122}_0$-$\mathbf{122}_x$ such that the S1 VSL is applied to by SL driver $\mathbf{132}_0$ to SL $\mathbf{182}_0$ and so that VWL is concurrently applied by all WL drivers $\mathbf{122}_0$-$\mathbf{122}_x$ to all WLs $\mathbf{183}_0$-$\mathbf{183}_x$, respectively. Additionally, initiating the multi-step forming operation at process 502 can further include enabling STC $\mathbf{143}_0$ for selected column C0.

Following initiation of the multi-step forming operation, the method can include continuous monitoring (e.g., sensing) IBL on BL $\mathbf{181}_0$ (e.g., through STC $\mathbf{143}_0$) (see process 504). The method can also include outputting (by STC $\mathbf{143}_0$) a digital output signal (Dout) with a first logic value (e.g., a logic "0") when IBL on BL $\mathbf{181}_0$ is below a threshold bit line current level (IBLmax) and with a second logic value (e.g., a logic "1") when IBL on BL $\mathbf{181}_0$ is at or above IBLmax. Dout can be output to a feedback circuit 160.

The method can further include: monitoring, by feedback circuit 160, the state of the received Dout (see process 506); maintaining, by feedback circuit 160, a VSL trim code 169 supplied to second charge pump 152 when Dout is at logic "0" and changing, by feedback circuit 160, the VSL trim code 169 supplied to second charge pump 152 when Dout switches from the logic "0" to logic "1" (see process 510). For example, in some embodiments, feedback circuit 160 can include a counter 162 and, this process of changing the VSL trim code 169 can include decrementing, by counter 162, a binary number (which is output from feedback circuit as the VSL trim code) each time Dout switches from logic "0" to logic "1" indicating completion of a current step and triggering initiation of the next step in the multi-step forming operation (i.e., causing second charge pump 152 to output VSL at the next lower voltage level for step 2 (S2)). It should be noted that as discussed above, feedback circuit 160 can optionally include a delay element 161 (e.g., a buffer) downstream of counter 162 (e.g., so as to be connected between the STC and counter). In this case, the method can also include delaying, by delay element 161, Dout for some period of time (e.g., approximately 10 ns) before receipt by counter 162 to prevent premature switching of VSL trim code 169 before IBL is steady at or above IBLmax (see process 508).

Once the VSL trim code 169 has changed at process 510, processes 504-510 can be repeated until the last step using the lowest voltage level for VSL has been completed (see process 512). Then, the multi-step forming operation for bit cells 101 in selected column C0 will end (see process 514). For example, first and second charge pumps 151-152, SL driver $\mathbf{132}_0$, STC $\mathbf{143}_0$, and WL drivers $\mathbf{122}_0$-$\mathbf{122}x$ will all be disabled. As discussed above, the multi-step forming operation (i.e., processes 502-514) can be performed to concurrently and progressively (with the performance of each step) change resistance states of programmable resistors 102 of all bit cells 101 in the selected column from a post-manufacture initial high resistance state (iHRS) (e.g., of ~100 MΩ or higher) to an operational resistance state that is lower than iHRS (e.g., to an operational high resistance state (HRS) of, for example, ~50 kΩ for storing a first logic value of, for example, a logic "0."

In the method embodiments as described above, VWL is at the same relatively low voltage level (e.g., 0.4V) for all steps of the forming operation. However, in alternative method embodiments, the voltage level of VWL during the last step or last few steps of the forming operation could also be decreased (e.g., from 0.4V to 0.35V). By stepping down VWL during this multi-step forming operation, RBC may be adjusted with even finer granularity.

Optionally, the method can further include verifying whether the bit cells 101 in the selected column reached the desired resistance state (e.g., HRS to store a logic "0") (see process 516). This verification process can include, for example, a reading operation (as described above) to determine the stored value in one bit cell in the selected column or multiple reading operations to determine stored values in some or all of the bit cells in the selected column. If the bit cell(s) in the selected column are determined to be storing the correct logic value (e.g., a logic "0"), then the forming operation for that selected column can be considered verified. However, if the bit cell(s) in the selected column are determined to be storing an incorrect logic value (e.g., a logic "1"), then the forming operation for that selected column can be considered unverified. In this case, further RBC adjusting may be required. For example, the last step of the multi-step forming operation using the same VWL (e.g., 0.4V) could be repeated or optionally one or more additional steps could be performed using an even lower VWL (e.g., 0.35V) (see process 518).

Once the multi-step forming process is completed in a selected column and, optionally, verified, another column can be selected and the processes described above can be repeated for the next selected column (see process 520).

It should be understood that in the method and structures described above, a semiconductor material refers to a material whose conducting properties can be altered by doping with an impurity. Examples of semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
- an array of bit cells in columns and rows;
- word lines connected to the rows;
- a word line decode block including word line drivers connected to the word lines; and
- source lines connected to the columns;
- a source line decode block connected to the source lines;
- bit lines connected to the columns;
- a bit line decode block connected to the bit lines and including at least one self-termination circuit;
- a voltage generation block including a first charge pump connected to the word line decode block and a second charge pump connected to the source line decode block; and
- a feedback circuit connected between the at least one self-termination circuit of the bit line decode block and the voltage generation block,
- wherein the first charge pump outputs a word line voltage to the word line decode block and the word line drivers concurrently apply the word line voltage to the word lines during a memory operation.

2. The structure of claim 1, wherein the memory operation includes a multi-step forming operation to concurrently change resistance states of programmable resistors of all bit cells in a selected column from an initial resistance state to an operational resistance state that is lower than the initial resistance state.

3. The structure of claim 1,
- wherein the source line decode block includes a source line multiplexer and source line drivers connectable to the source lines through the source line multiplexer,
- wherein the memory operation includes a multi-step forming operation and, during the multi-step forming operation, the second charge pump outputs different source line voltages to the source line decode block in response to different source line voltage trim codes, the source line multiplexer connects a source line driver to a source line for a selected column, and the source line driver applies the different source line voltages to the source line during different steps of the multi-step forming operation.

4. The structure of claim 3, wherein the different source line voltages decrease with each successive step of the different steps.

5. The structure of claim 3, wherein each bit cell includes an access transistor having a gate connected to a word line for a row, and wherein, during the multi-step forming operation, the word line voltage is 0.4 volts and a first source line voltage of the different source line voltages is 4 volts.

6. The structure of claim 3,
- wherein the bit line decode block includes a bit line multiplexer and the at least one self-termination circuit connectable to the bit lines through the bit line multiplexer,
- wherein, during the multi-step forming operation, the bit line multiplexer connects a self-termination circuit to a bit line of the selected column and the self-termination circuit senses a bit line current on the bit line and outputs a digital output signal with a first logic value when a current level of the bit line current on the bit line is below a threshold bit line current level and with a second logic value when the current level is at or above the threshold bit line current level.

7. The structure of claim 6, wherein the threshold bit line current level is equal to a predetermined bit cell current level times a total number of bit cells in each column.

8. The structure of claim 6, wherein, during the multi-step forming operation, the feedback circuit receives the digital output signal and changes a source line voltage trim code supplied to the second charge pump when the digital output signal switches from the first logic value to the second logic value.

9. The structure of claim 8, wherein the feedback circuit includes a counter that decrements a binary number output from the feedback circuit as the source line voltage trim code each time the digital output signal switches from the first logic value to the second logic value indicating completion of a current step and triggering initiation of a next step.

10. The structure of claim 9, wherein the feedback circuit further includes a delay element connected between the self-termination circuit and the counter.

11. A method comprising:

performing a memory operation in a memory structure, wherein the memory structure includes: an array of bit cells in columns and rows; word lines connected to the rows; a word line decode block including word line drivers connected to the word lines; source lines connected to the columns; a source line decode block connected to the source lines; bit lines connected to the columns; a bit line decode block connected to the bit lines and including at least one self-termination circuit; a voltage generation block including a first charge pump connected to the word line decode block and a second charge pump connected to the source line decode block; and a feedback circuit connected between the at least one self-termination circuit of the bit line decode block and the voltage generation block, and wherein the performing of the memory operation includes:

outputting, by the first charge pump to the word line decode block, a word line voltage to the word line decode block; and concurrently applying, by the word line drivers, the word line voltage to the word lines.

12. The method of claim 11, wherein the memory operation includes a multi-step forming operation to concurrently change resistance states of programmable resistors of all bit cells in a selected column from an initial resistance state to an operational resistance state that is lower than the initial resistance state.

13. The method of claim 11, wherein the source line decode block includes a source line multiplexer and source line drivers connectable to the source lines through the source line multiplexer, and wherein the memory operation is a multi-step forming operation including:

outputting, by the second charge pump, different source line voltages to the source line decode block in response to different source line voltage trim codes, respectively;

connecting, by the source line multiplexer, a source line driver to a source line for a selected column; and applying, by the source line driver, the different source line voltages to the source line during different steps of the multi-step forming operation.

14. The method of claim 13, wherein the different source line voltages decrease with each successive step of the different steps.

15. The method of claim 13, wherein each bit cell includes an access transistor having a gate connected to a word line for a row, and wherein, during the multi-step forming operation, the word line voltage is 0.4 volts and a first source line voltage of the different source line voltages is 4 volts.

16. The method of claim 13, wherein the bit line decode block includes a bit line multiplexer and the at least one self-termination circuit connectable to the bit lines through the bit line multiplexer, and wherein the multi-step forming operation further includes:

connecting, by the bit line multiplexer, a self-termination circuit to a bit line of the selected column;

sensing, by the self-termination circuit, a current level on the bit line; and outputting, by the self-termination circuit, a digital output signal with a first logic value when the current level on the bit line is below a threshold bit line current level and with a second logic value when the current level is at or above the threshold bit line current level.

17. The method of claim 16, wherein the threshold bit line current level is equal to a predetermined bit cell current level times a total number of bit cells in each column.

18. The method of claim 16, wherein the multi-step forming operation further includes:

receiving, by the feedback circuit, the digital output signal; and changing, by the feedback circuit, a source line voltage trim code supplied to the second charge pump when the digital output signal switches from the first logic value to the second logic value.

19. The method of claim 18, wherein the feedback circuit includes a counter and wherein the changing of the source line voltage trim code includes decrementing, by the counter, a binary number output from the feedback circuit as the source line voltage trim code each time the digital output signal switches from the first logic value to the second logic value indicating completion of a current step and triggering initiation of a next step.

20. The method of claim 19, wherein the feedback circuit further includes a delay element connected between the self-termination circuit and the counter, and wherein the multi-step forming operation further includes delaying, by the delay element, the digital output signal before receipt by the counter.

* * * * *